(12) United States Patent
Amel et al.

(10) Patent No.: US 11,303,426 B2
(45) Date of Patent: Apr. 12, 2022

(54) PHASE LOCKED LOOP SWITCHING IN A COMMUNICATION SYSTEM

(71) Applicant: Intel Corporation, Santa Clara, CA (US)

(72) Inventors: Roy Amel, Haifa (IL); Eran Segev, Tel Aviv (IL); Shahar Gross, Nes-Tziona (IL)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 16/643,476

(22) PCT Filed: Sep. 29, 2017

(86) PCT No.: PCT/US2017/054574
§ 371 (c)(1),
(2) Date: Feb. 28, 2020

(87) PCT Pub. No.: WO2019/066954
PCT Pub. Date: Apr. 4, 2019

(65) Prior Publication Data
US 2020/0366457 A1 Nov. 19, 2020

(51) Int. Cl.
*H04L 7/08* (2006.01)
*H04L 7/033* (2006.01)
(Continued)

(52) U.S. Cl.
CPC .............. *H04L 7/0331* (2013.01); *H03L 7/08* (2013.01); *H04L 69/22* (2013.01); *H04W 84/12* (2013.01)

(58) Field of Classification Search
CPC ....................................................... H04L 69/22
(Continued)

(56) References Cited

U.S. PATENT DOCUMENTS

2003/0184347 A1* 10/2003 Haroun ................ H03K 3/0322
327/99
2005/0135290 A1 6/2005 Kluge et al.
(Continued)

FOREIGN PATENT DOCUMENTS

| CN | 111095887 | 5/2020 |
| DE | 112017008131 | 7/2020 |
| WO | 2019066954 | 4/2019 |

OTHER PUBLICATIONS

"International Application Serial No. PCT US2017 054574, International Search Report dated Jun. 26, 2018", 3 pgs.
(Continued)

*Primary Examiner* — Dang T Ton
(74) *Attorney, Agent, or Firm* — Schwegman Lundberg & Woessner, P.A.

(57) ABSTRACT

An apparatus include a baseband processor configured to receive digital samples of a first wireless local area network (WLAN) signal demodulated with a first phase locked loop (PLL). The baseband processor is configured to determine whether to switch from using the first PLL to demodulate the first WLAN signal to a second PLL to demodulate the first WLAN signal. The apparatus further includes a selection circuit coupled to the first PLL and the second PLL. The selection switch is configured to switch from the first PLL to the second PLL based on the determination. The baseband processor is configured to receive additional digital samples of the first WLAN signal demodulated with the second PLL.

17 Claims, 11 Drawing Sheets

(51) Int. Cl.
  *H03L 7/08* (2006.01)
  *H04L 69/22* (2022.01)
  *H04W 84/12* (2009.01)
(58) Field of Classification Search
  USPC .......................................................... 370/400
  See application file for complete search history.

(56) References Cited

U.S. PATENT DOCUMENTS

2008/0317185 A1* 12/2008 Mueller .................... H03L 7/07
                                                    375/376
2010/0026345 A1    2/2010  Li
2014/0301259 A1* 10/2014 Homchaudhuri ..... G06F 1/3206
                                                    370/311

OTHER PUBLICATIONS

"International Application Serial No. PCT US2017 054574, Written Opinion dated Jun. 26, 2018", 10 pgs.
"International Application Serial No. PCT US2017 054574, International Preliminary Report on Patentability dated Apr. 9, 2020", 12 pgs.

* cited by examiner

PHASE LOCKED LOOP SWITCHING IN A COMMUNICATION SYSTEM

BACKGROUND

A phase-locked loop (PLL) may be an electronic circuit with an oscillator that adjusts to match the frequency of an input signal. The PLL may be for wireless communication, such as frequency modulation (FM) transmissions or phase modulation (PM) transmissions. The PLL may be used to generate, stabilize, modulate, demodulate, filter, or recover a signal from a noisy communications channel.

BRIEF DESCRIPTION OF THE DRAWINGS

Various aspects of the present invention will be understood more fully from the detailed description given below and from the accompanying drawings of various aspects of the invention.

DESCRIPTION OF ASPECTS

Figure 1:
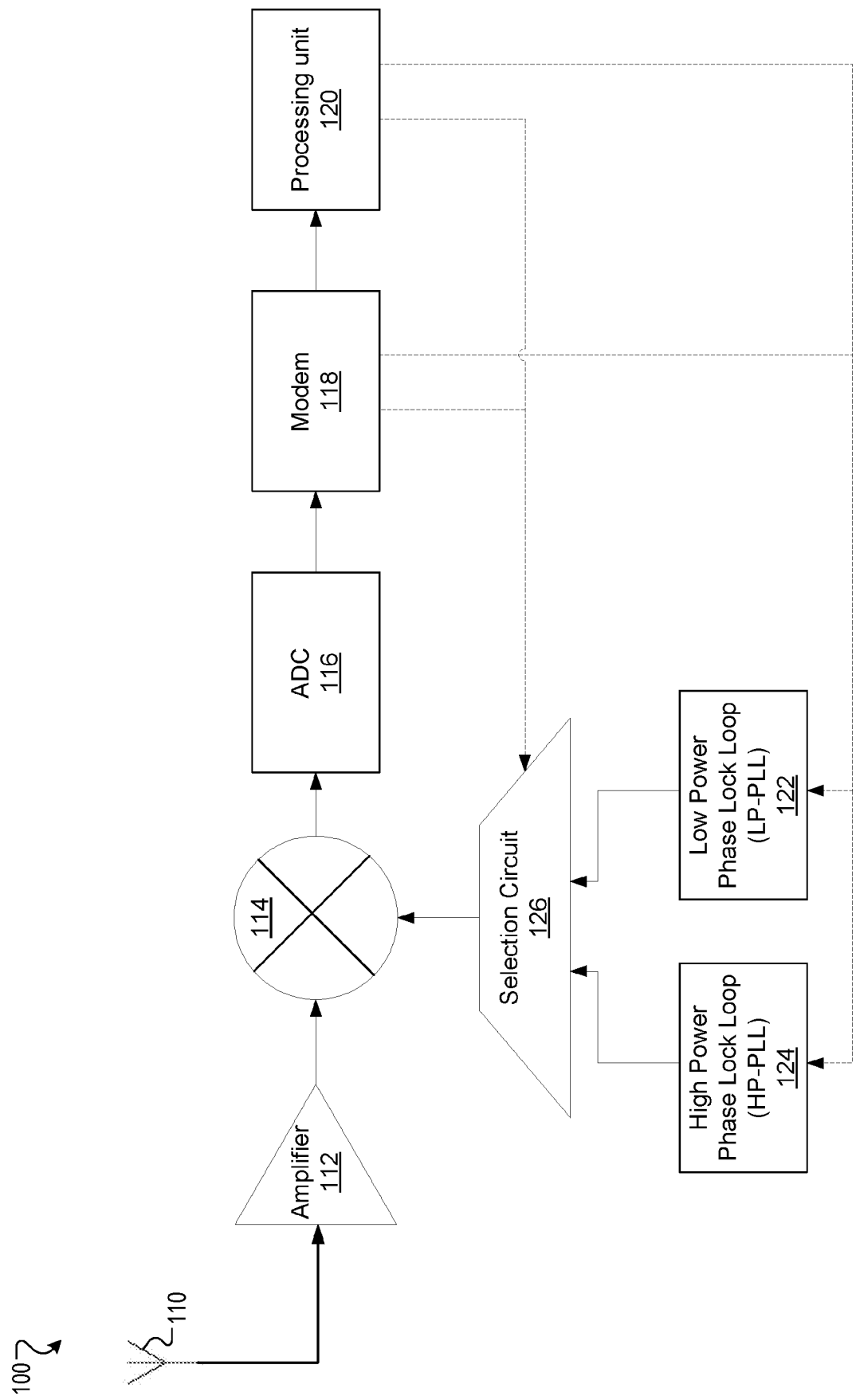
FIG. 1 illustrates a communication system with a low-power phase locked loop (LP-PLL) and a high-power phase locked loop (HP-PLL), according to one aspect.

A wireless local area network (WLAN) may support data communications at relatively high data rates and at relatively low costs. Networking infrastructures and mobile devices may use WLANs, when available, to send or receive data. Despite the high data rate and low cost, the energy consumption for communicating using a WLAN may be inefficient. For example, a communication system may account for more than ten percent of the energy consumption in a mobile device. The inefficient energy consumption of the communication system may arise from the communication system idly monitoring for a signal in order to detect data packets that may arrive at unpredictable times. The power consumption by the communication system during the idle monitoring may be comparable to the power consumption by the communication system during an active transmission or reception of packets. The communication system may idly monitor for a signal for a large percentage of the time a device is operating.

Additionally, as an amount of data communicated over a WLAN increases, the communication system may use a high-power PLL (HP-PLL) to generate, stabilize, modulate, demodulate, filter, or recover a signal that is communicated over a noisy communications channel. For example, an older communication standard with relatively slow data transfer rates may require that a signal to noise ratio (SNR) is 35 decibels (dB) to communicate data over the WLAN. A newer communication standard with relatively high data transfer rates may require that an SNR is 75 dB to communicate the data over the WLAN. To meet the newer communication standard, the communication system may use the HP-PLL to compensate for the higher SNR of 75 dB. However, the HP-PLL may consume an increased amount of power to compensate for the higher SNR requirement.

The aspects described herein may address the above-noted deficiencies by providing a communication system that operates using an low-power PLL while monitoring for a signal. In one aspect, when a signal is received, a processing device of the communication system may switch a selection circuit from using the LP-PLL to using the HP-PLL. The LP-PLL operates at a first power level and the HP-PLL operates at a second power level, the second power level being higher than the first power level. In another aspect, when a signal is received, the processing device may determine whether the signal is for a first communication standard with a first SNR threshold associated with an LP-PLL or a second communication standard with a second SNR threshold associated with an HP-PLL. When the signal corresponds to the second communication standard, the processing device may switch from using the LP-PLL to using the HP-PLL. When the signal corresponds to the first communication standard, the processing device may continue to use the LP-PLL. The communication system using the LP-PLL to monitor for the signal and for demodulation and filtering of signals may reduce a power consumption level of the communication system.

FIG. 1 illustrates a communication system 100 with a LP-PLL 122 and a HP-PLL 124, according to one aspect. The communication system 100 may include an antenna 110, an amplifier 112, a mixer 114, an analog-to-digital converter (ADC) 116, a modem 118, a processing unit 120, the LP-PLL 122, the HP-PLL 124, and a selection circuit 126. The communication system 100 may receive an analog signal via the antenna 110. The amplifier 112 may be coupled to the antenna 110. The amplifier 112 may receive the analog signal from the antenna 110 and amplify the analog signal to increase an amplitude of the analog signal. The mixer 114 may be coupled to the amplifier 112. The mixer 114 may receive the analog signal from the amplifier 112 and may combine the analog signal with an analog signal from the LP-PLL 122 or the HP-PLL 124, as discussed below. The ADC 116 may be coupled to the mixer 114. The ADC 116 may receive the analog signal and convert the analog format into a digital format or digital samples of the analog signal to a digital format. In one aspect, a baseband processor comprises some or all of the various components illustrated and described with respect to FIG. 1. The baseband processor may be a network interface that manages the communications by the communication system 100, such as managing a timing of when to transmit a signal using the antenna 110. In one implementation, the baseband processor can include the ADC 116, the modem 118, and the processing unit 120. In another implementation, the baseband processor also includes the selection circuit 126 and/or the HP-PLL 124 and LP-PLL 122. Whereas in other implementations, the selection circuit 126 and/or the HP-PLL 124 and LP-PLL 122 can be implemented off-chip from the baseband processor. Alternatively, other configurations of the components of the communication system 100 are possible.

The modem 118 may be coupled to the ADC 116. The modem 118 may receive the digital samples and demodulate the digital signal to decode data in the digital samples. The processing unit 120 may be coupled to the modem 118. The processing unit 120 may receive the data from the modem 118 and execute one or more instructions included in the data. The LP-PLL 122, the HP-PLL 124, and the selection circuit 126 may be coupled to the modem 118 and/or the processing unit 120. The LP-PLL 122 may operate at a relatively low power consumption level compared to the HP-PLL 124. The LP-PLL 122 may be a first means for filtering and demodulating a signal. The HP-PLL 124 may be a second means for filtering and demodulating the signal. The LP-PLL 122 may for filter and demodulate a signal at a relatively low signal to noise ratio (SNR) compared to the SNR of the HP-PLL 124.

In one aspect, when the modem 118 or the processing unit 120 receives the digital signal, the modem 118 or the processing unit 120 may determine whether to switch between using the LP-PLL 122 and the HP-PLL 124. When the modem 118 or the processing unit 120 determines to switch, the modem 118 or the processing unit 120 send a control signal (or a sequence of control signals) to the selection circuit 126 to connect the HP-PLL 124 to the mixer 114 based on the determination. In one example, when the modem 118 or the processing unit 120 controls the selection circuit 126 to switch from the LP-PLL 122 to the HP-PLL 124, the modem 118 or the processing unit 120 may send a disable command to disable the LP-PLL 122 and an enable command to enable the HP-PLL 124. In another example, when the modem 118 or the processing unit 120 controls the selection circuit 126 to switch from the HP-PLL 124 to the LP-PLL 122, the modem 118 or the processing unit 120 may send a disable command to the selection circuit 126 to disable the HP-PLL 124 and an enable command to enable the LP-PLL 122.

In one aspect, the selection circuit 126 may be a multiplexer (MUX). In another aspect, the selection circuit 126 may be a switch. To switch between the LP-PLL 122 and the HP-PLL 124, the LP-PLL 122 and the HP-PLL 124 may be fast locking PLLs. A fast locking PLL may be a PLL that may perform quick switching by using fast lock algorithm to lock a frequency and phase of a PLL within a short amount of time. In one example, the short amount of time may be within than 5 microseconds (μsec).

The selection circuit 126 may be a glitch-less multiplexer (referred to herein as a glitch-less MUX). The glitch-less multiplexer is controlled by signals from the modem 118 or the processing unit 120. A glitch may be caused in a communication system when a MUX switches between different clock sources, where a timing of the different clock sources is different or asynchronous. In one example, the difference in the timing of the clock sources may cause a MUX to delay the switching between the PLLs or send a signal at the wrong time. In another example, the glitch may be interpreted as a capture clock edge by a first register of a processor or memory while not being interpreted as a capture clock edge by a second register. The glitch-less MUX may switch between the different clock sources without glitches by synchronizing the clocks of the different clock sources prior to switching between the LP-PLL 122 and the HP-PLL 124.

The modem 118 or the processing unit 120 may also send an input signal to the LP-PLL 122 or the HP-PLL 124, depending on which PLL is being used in the communication system 100. The LP-PLL 122 or the HP-PLL 124 may use the input signal to match a frequency of the signal the mixer 114 receives from the amplifier 112. The LP-PLL 122 or the HP-PLL 124 may send an output signal to the mixer 114 via the selection circuit 126. The mixer 114 may combine the output signal with the signal from the amplifier 112 to demodulate the signal from the amplifier 112. The mixer 114 may also combine the output signal with the signal from the amplifier 112 to filter noise or remove noise from the signal from the amplifier 112.

In another aspect, the modem 118 or the processing unit 120 may determine whether the digital signal is for a first communication standard or a second communication standard. In one example, the first communication standard may require a relatively low signal to noise ratio (SNR), such as 35 dB, to demodulate the signal. In another example, the second communication standard may require a relatively high SNR, such as 75 dB, to demodulate the signal. When the modem 118 or the processing unit 120 determines that the signal is for the first communication standard, the modem 118 or the processing unit 120 may send a signal to the selection circuit 126 to connect the LP-PLL 122 to the mixer 114. When the modem 118 or the processing unit 120 determines that the signal is for the second communication standard, the modem 118 or the processing unit 120 may send another signal to the selection circuit 126 to connect the HP-PLL 124 to the mixer 114. The modem 118 or the processing unit 120 can send a single signal to connect one of the PLLs and disconnect the other one of the PLLs. Alternatively, the modem 118 or the processing unit 120 can send multiple signals to connect and disconnect the respective PLLS to the mixer 114.

The LP-PLL 122 or the HP-PLL 124, respectively, may use the input signal to match a frequency of the signal the mixer 114 receives from the amplifier 112. The LP-PLL 122 or the HP-PLL 124 may send an output signal to the mixer 114 via the selection circuit 126. The mixer 114 may combine the output signal with the signal from the amplifier 112 to demodulate the signal from the amplifier 112. The mixer 114 may also combine the output signal with the signal from the amplifier 112 to filter noise or remove noise from the signal from the amplifier 112.

Figure 2:
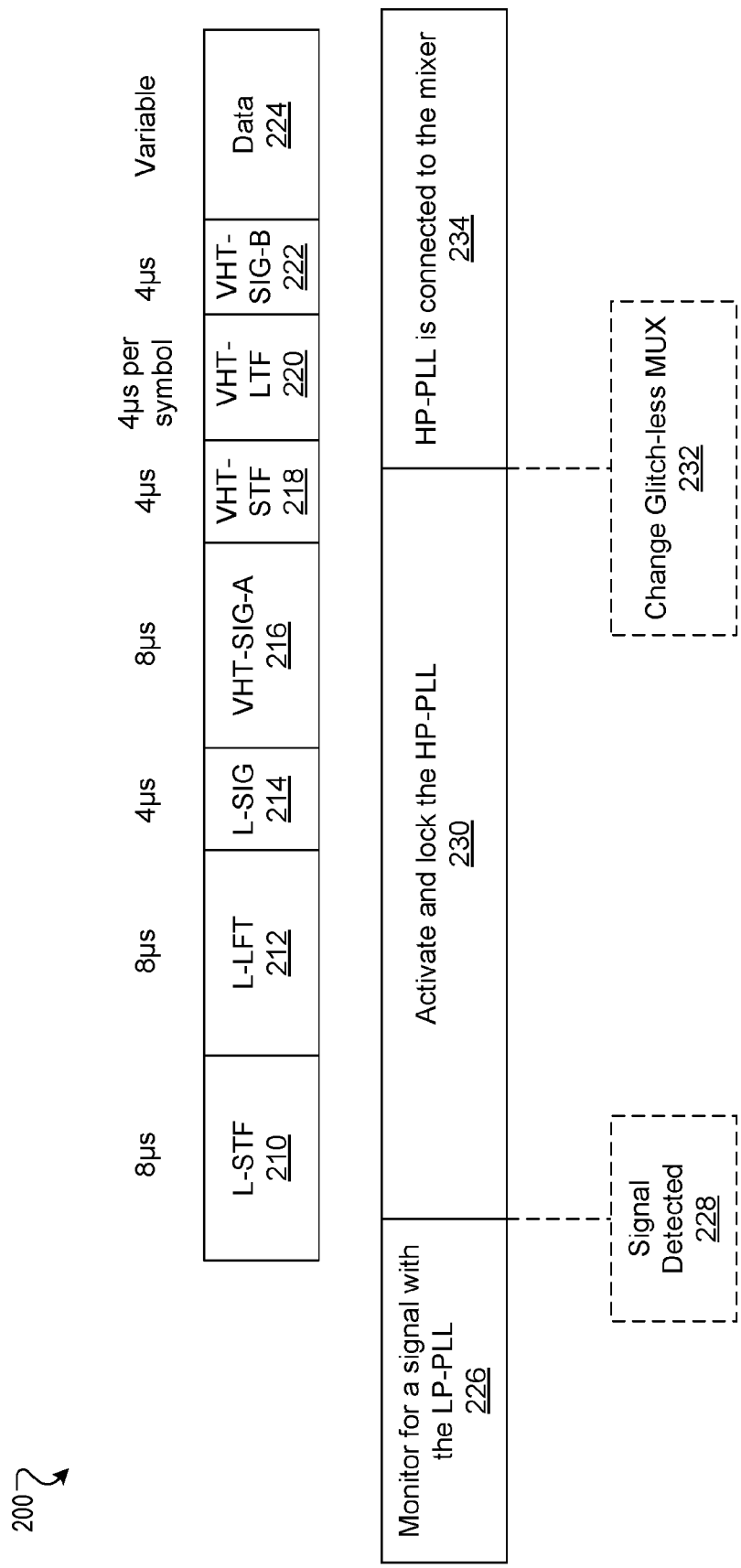
FIG. 2 illustrates data fields of a signal in a very high throughput (VHT) format received by the communication system in FIG. 1, according to one aspect.

FIG. 2 illustrates data fields 210-224 of a packet in a very high throughput (VHT) format for a signal 200 received by the communication system 100 in FIG. 1, according to one aspect. The signal 200 may include a non-high throughput legacy short training field (L-STF) 210, a non-HT legacy long training field (L-LFT) 212, a non-HT signal field (L-SIG) 214, a VHT signal A field (VHT-SIG-A) 216, a VHT short training field (VHT-SFT) 218, a VHT long training field (VHT-LTF) 220, a VHT signal B field (VHT-SIG-B) 222, and a data field 224.

The L-SFT 210 and the L-LFT 212 may be a header for the packet of signal 200. Data in the L-SFT 210 may be received at the communication system 100 over a period of approximately 8 microseconds (μs). Data in the L-LFT 212 may be received at the communication system 100 over a period of approximately 8 microseconds (μs). In one example, the format of the L-STF 210 and the L-LFT 212 may be backward compatible or legacy compatible. For example, the format of the L-STF 210 and the L-LFT 212 may conform to a current communication standard, such as the institute of electrical and electronics engineers (IEEE) 802.11ac or 802.11ax standard and also conform to the IEEE 802.11a/b/g/n standards. In one example, when the communication system 100 is configured to support the IEEE 802.11ac standard, the communication system 100 may also recognize the IEEE 802.11a standard for the L-STF 210 and the L-LFT 212. The IEEE 802.11ac standard may require a higher SNR than the IEEE 802.11a standard Where the communication standard for the L-STF 210 and the L-LFT 212 may be the same for both the IEEE 802.11ac and the IEEE 802.11a standards, the communication system 100 may operate using the LP-PLL 122 to receive signals in the IEEE 802.11ac and the IEEE 802.11a standards. The communication system 100 may switch to using the HP-PLL 124 when demodulating the data fields 214-224 when the signal conforms to the IEEE 802.11ac standard. For example, the modem 118 or the processing unit 120 may inspect a header of the signal 200. The modem 118 or the processing unit 120 may control the selection circuit 126 (e.g., by sending a control signal) to switch from the LP-PLL 122 to the HP-PLL 124 when the header identifies a first or defined format of the signal 200. The selection circuit 126 is configured to switch from the LP-PLL 122 to the HP-PLL 124 based on the control signal. The modem 118 or the processing unit 120 may control the selection circuit 126 to continue to connect the LP-PLL 122 to the mixer 114 when the header identifies a second format of the signal 200. In another aspect, when the communication system 100 is operating in a power saving mode, the modem 118 or the processing unit 120 may control the selection circuit 126 to continue to connect the LP-PLL 122 to the mixer 114.

Data in the L-SIG 214 may be received at the communication system 100 over a period of approximately 4 microseconds (µs). Data in the VHT-SIG-A 216 may be received at the communication system 100 over a period of approximately 8 µs. Data in the VHT-STF 218 may be received at the communication system 100 over a period of approximately 4 µs. Data in the VHT-LTF 220 may be received at the communication system 100 over a period of approximately 4 µs per symbol. Data in the VHT-SIG-B 222 may be received at the communication system 100 over a period of approximately 4 µs. An amount of time the communication system 100 receives the data in the data field 224 may vary based on the amount of data stored in the data field 224.

In one aspect, the communication system 100 may monitor for a signal while using the LP-PLL 122 in FIG. 1 (block 226). For signal 200, the communication system 100 may detect the signal as the communication system 100 receives the data in the L-STF 210 (block 228). When the communication system 100 detects the signal, the communication system 100 may activate and lock the HP-PLL 124 in FIG. 1 (block 230). In one example, the communication system 100 may activate and lock the HP-PLL 124 while receiving at least a portion of the data from at least one of the data fields 210-218.

The switching between the LP-PLL 122 and the HP-PLL 124 may include a settling time and a clean period where the frequency offset, the phase, and the received current differences between the LP-PLL 122 and the HP-PLL 124 may be estimated and corrected by the modem 118 or the processing unit 120. In one example, the settling time and clean period may be approximately 3 µsec to 8 µsec.

The data fields 214-224 may be defined in a communication standard as a period of time to readjust an automatic gain control of the communication system 100 for a multiple input, multiple output (MIMO) signal or a beam formed signal with a different energy level than a single input single output (SISO) signal. The switching between the LP-PLL 122 and the HP-PLL 124 may be triggered at the time after an AGC adjustment has occurred. A direct current (DC) power level estimate and a frequency estimation for the communication system 100 may occur after switching between the LP-PLL 122 and the HP-PLL 124.

When the modem 118 or the processing unit 120 has activated and locked the HP-PLL 124, the modem 118 or the processing unit 120 of the communication system 100 may send a signal to the selection circuit 126 to switch from sending the output signal from the LP-PLL 122 to sending the output signal from the HP-PLL 124 (block 232), as discussed above. When the communication system 100 has activated and locked the HP-PLL 124 and switched the selection circuit 126, the HP-PLL 124 may be connected to the mixer 114 (block 234).

The format of the packet for the signal 200 is not intended to be limiting. For example, the communication system 100 may receive a signal with a VHT format, a high throughput (HT) format, a high efficiency (HE) format, and so forth.

Figure 3A:
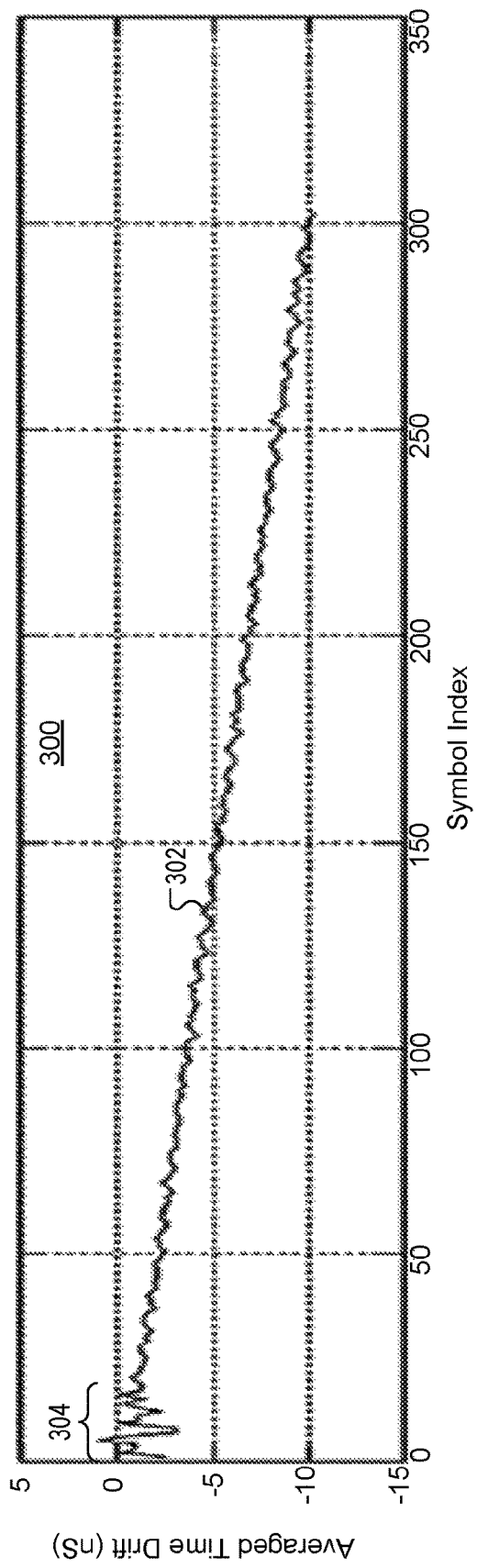
FIG. 3A illustrates a graph with an average drift time per symbol of the packets for a signal, according to one aspect.

FIG. 3A illustrates a graph 300 with an average drift time per symbol of the packets for a signal 302, according to one aspect. Graph 300 shows a flow of the communication system 100 in FIG. 1 switching between the LP-PLL 122 and the HP-PLL 124 when the communication system 100 receives the signal 302. Period 304 of the signal 302 shows a phase slope per symbol of the packets when the communication system 100 switches between the LP-PLL 122 and the HP-PLL 124. For example, the communication system 100 may switch between the 16$^{th}$ data symbol in the data fields 210-224 in FIG. 2. The phase slope may represent a timing drift of the packets.

Figure 3B:
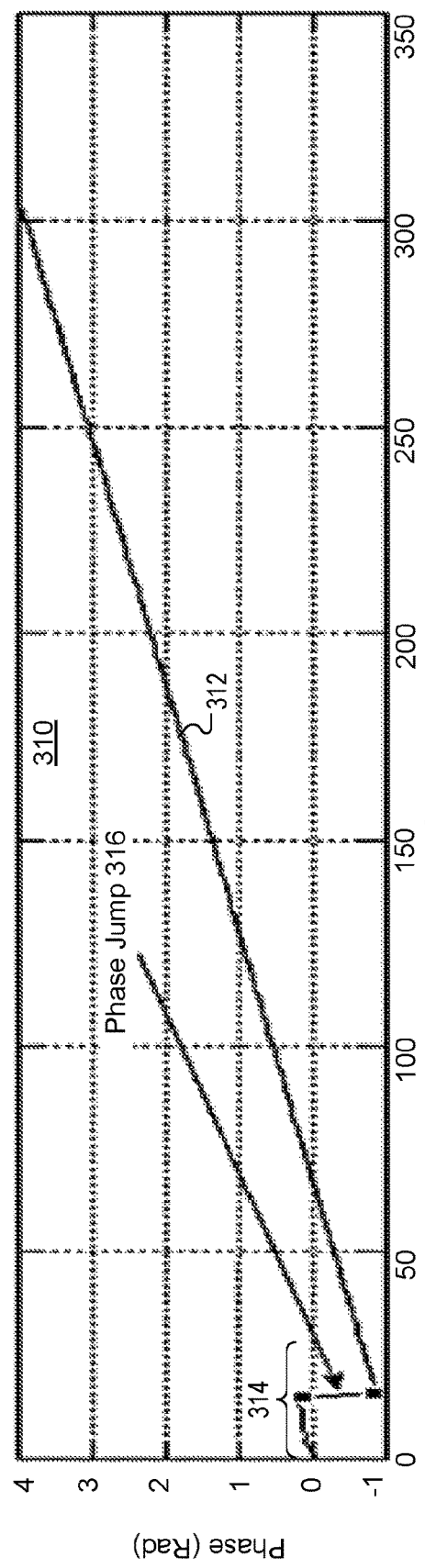
FIG. 3B illustrates a graph with a common phase per symbol of the packets for a signal, according to one aspect.

FIG. 3B illustrates a graph 310 with a common phase per symbol of the packets for a signal 312, according to one aspect. Period 314 of the signal 312 may show a common phase per symbol of the packets when the communication system 100 switches between the LP-PLL 122 and the HP-PLL 124. The common phase may represent a phase and a frequency error of the packets. At point 316, the communication system 100 of FIG. 1 switches between the LP-PLL 122 and the HP-PLL 124 and there may be a jump in the phase of the signal 312. For example, the switching between the LP-PLL 122 and the HP-PLL 124 may cause a phase jump or a gain jump because of the different oscillator sources of the LP-PLL 122 and the HP-PLL 124.

In one aspect, the jump in phase may be anticipated and the communication system 100 may compensate for the jump in phase. For example, the jump in phase may be approximately the same each time the communication system switches between the LP-PLL 122 and the HP-PLL 124. In one example, the communication system 100 can store a value representing a previous jump in phase. The communication system 100 may compensate for the jump in phase when switching between the LP-PLL 122 and the HP-PLL 124 by adjusting the phase of the signal by an amount opposite to the stored value. In another example, the communication system 100 may store a value representing an average of several previous jumps in phase and may compensate for the jump in phase when the communication system 100 switches between the LP-PLL 122 and the HP-PLL 124 using the stored average value.

Figure 4:
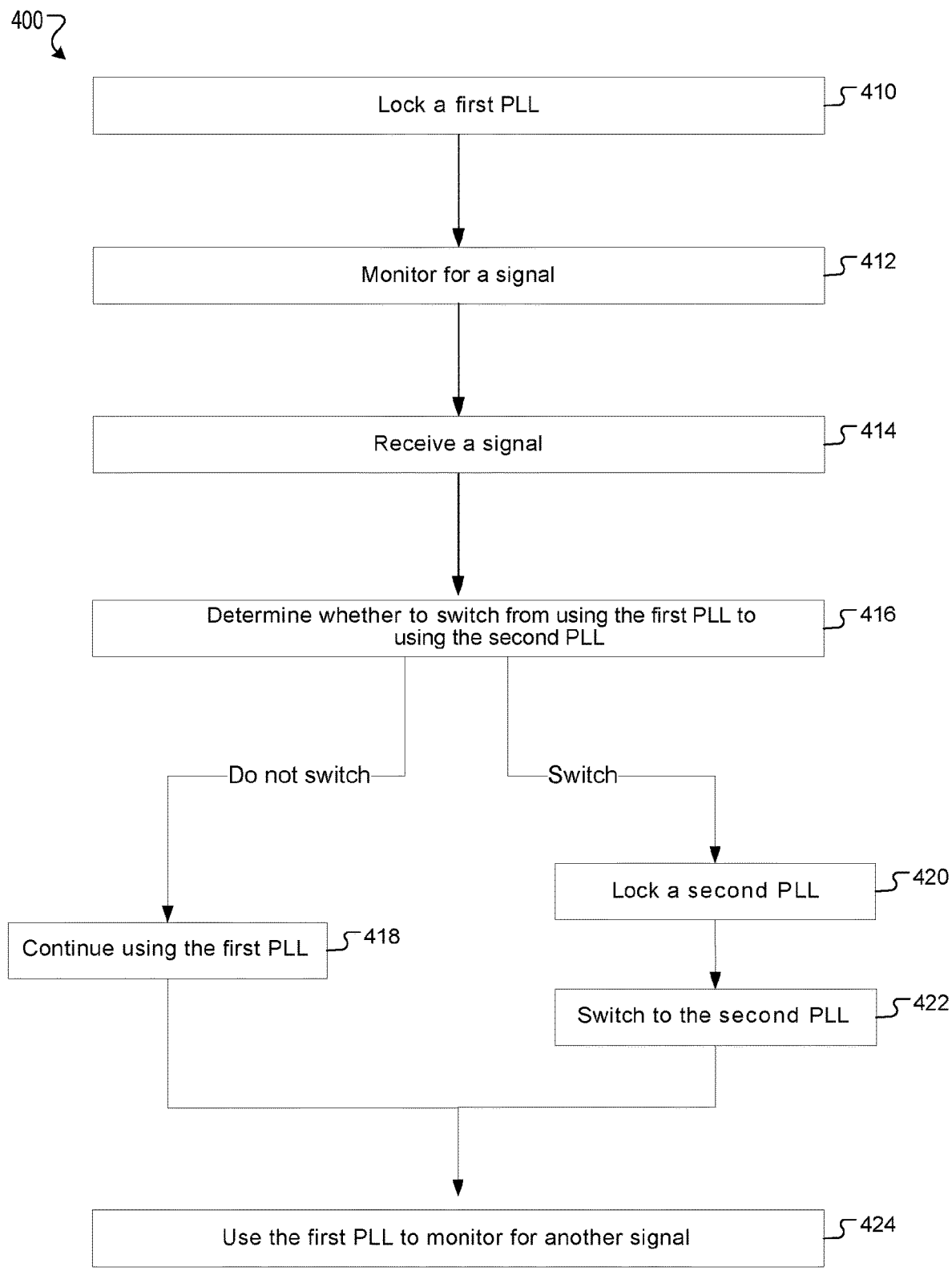
FIG. 4 illustrates a flowchart of the method for determining whether to switch between a first PLL and a second PLL in a communication system, according to one aspect.

FIG. 4 illustrates a flowchart of the method 400 for determining whether to switch between a first PLL and a second PLL in a communication system, according to one aspect. The method 400 may at least partially be performed by processing logic that includes hardware (e.g., circuitry, dedicated logic, programmable logic, microcode, etc.), software (e.g., instructions executed by a processing device), firmware or a combination thereof. In one aspect, the method 400 may be performed by all or part of the communication system 100 of FIG. 1. For example, the method 400 may be performed by the processing unit 120 of FIG. 1.

Referring to FIG. 4, the method 400 begins with a processing device of a communication system locking a frequency for a first PLL to operate at (block 410). For example, a processing device may select a first frequency for the first PLL to demodulate a signal and lock the frequency of the first PLL as the first frequency. The method may include the communication system monitoring for a signal in a network (block 412). The method may include receiving a signal at an antenna of the communication system (block 414). The method may include the processing device determining whether to switch from the first PLL to using a second PLL in response to receiving the signal (block 416). In one aspect, the first PLL may provide a low SNR and the second PLL may provide a high SNR. In another aspect, to determine whether to switch from using the first PLL to using a second PLL, the processing device may switch to using the second PLL in response to receiving the signal. In another aspect, to determine whether to switch from using the first PLL to using a second PLL, the processing device may determine a format of the data in the signal. For example, when the format of the data is for an IEEE 802.11 11 g/n/a standard. the processing device may determine not to switch to the second PLL. When the format of the data is for an IEEE 802.11ac/ax standard, the processing device may determine to switch to the second PLL.

When the processing device determines not to switch to using the second PLL, the processing device may continue using the first PLL (block 418). When the processing device determines to switch to using the second PLL, the processing device may lock the frequency of the second PLL (block 420). When the frequency of the second PLL is locked, the processing device may switch to using the second PLL (block 422). In one aspect, as the processing device is determining whether to use the first PLL or switch to using the second PLL, the processing device may receive the signal while using the first PLL. When the processing device has received the entire signal or stops receiving the signal, the processing device switch to or continue using the first PLL to monitor for another signal (block 424).

In another implementation, processing logic of a communication system performs a process in which the processing logic receives digital samples of a first wireless local area network (WLAN) signal demodulated with a first phase locked loop (PLL). The processing logic determines whether to switch from using the first PLL to demodulate the first WLAN signal to using a second PLL to demodulate the first WLAN signal. The processing logic selects the second PLL to demodulate additional digital samples of the first WLAN signal based on a determination to switch from using the first PLL to the second PLL. The processing logic receives the additional digital samples of the first WLAN signal demodulated with the second PLL. In a further implementation, the processing logic selects the second PLL by determining that a header of the signal indicates that the signal is in a defined format. The processing logic sends a control signal to a selection circuit to disconnect the first PLL from a mixer and to connect the second PLL to the mixer. Alternatively, the processing logic disconnects the first PLL from a mixer and connects the second PLL using a selection circuit based on the determination that the signal is in the defined format.

In a further implementation, the processing logic determines that an entire signal has been received and selects the first PLL to switch back from using the second PLL to using the first PLL based on a determination that the entire signal has been received.

Figure 5:
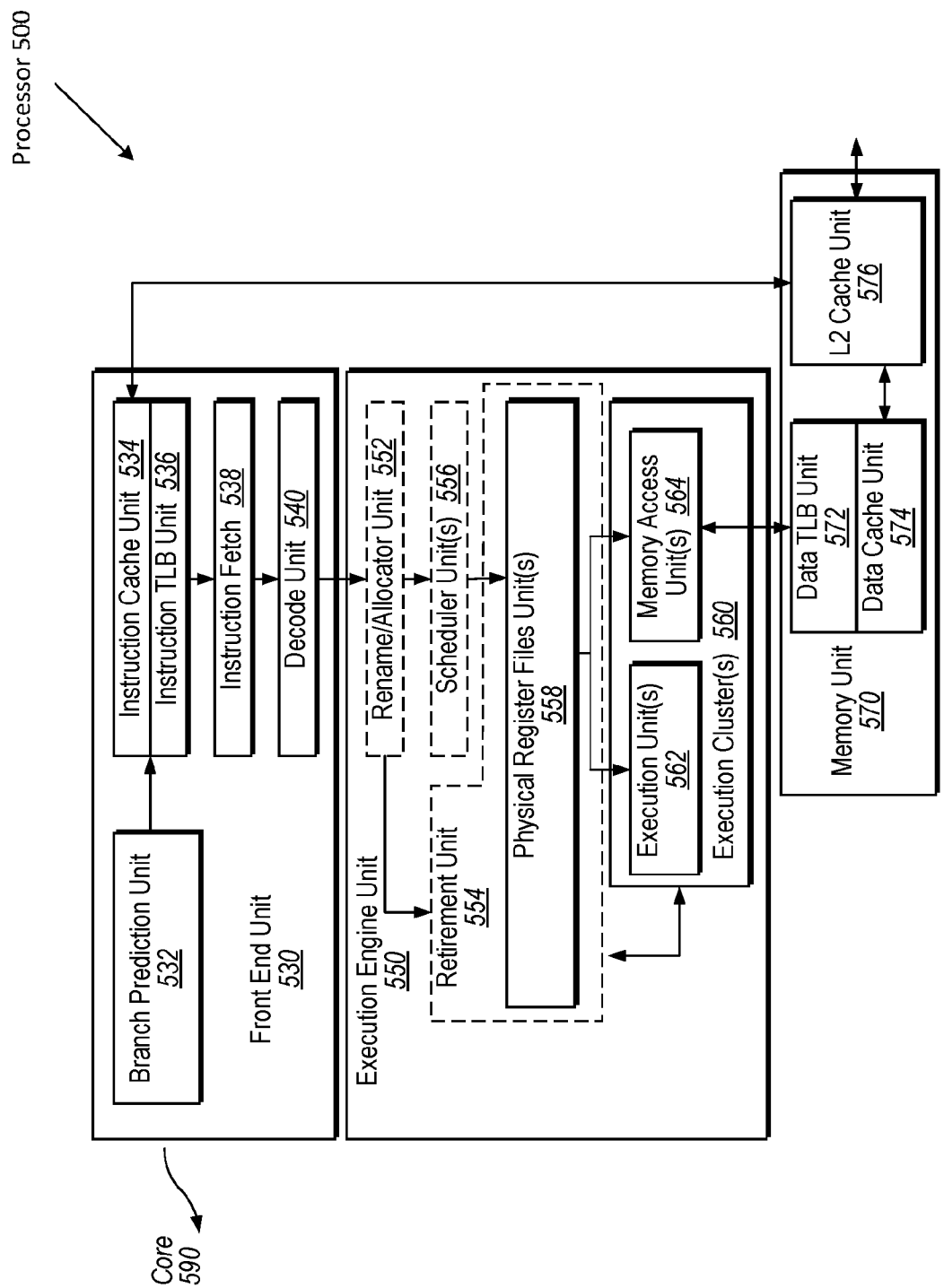
FIG. 5 is a block diagram illustrating a micro-architecture for the communication system of FIG. 1, according to one aspect.

FIG. 5 is a block diagram illustrating a micro-architecture for a processor 500 that implements the communication system 100 of FIG. 1 according to one aspect. Specifically, processor 500 depicts an in-order architecture core and a register renaming logic, out-of-order issue/execution logic to be included in a processor according to at least one aspect of the disclosure. The aspects of the communication system 100 of FIG. 1 may be implemented in processor 500.

Processor 500 includes a front end unit 530 coupled to an execution engine unit 550, and both are coupled to a memory unit 570. The processor 500 may include a core 590 that is a reduced instruction set computing (RISC) core, a complex instruction set computing (CISC) core, a very long instruction word (VLIW) core, or a hybrid or alternative core type. As yet another option, processor 500 may include a special-purpose core, such as, for example, a network or communication core, compression engine, graphics core, or the like. In another aspect, the core 590 may have five stages.

The front end unit 530 includes a branch prediction unit 532 coupled to an instruction cache unit 534, an instruction cache unit 534 is coupled to an instruction translation lookaside buffer (TLB) unit 536, instruction TLB unit 536 being coupled to an instruction fetch unit 538, and the instruction fetch unit 538 being coupled to a decode unit 540. The decode unit 540 (also known as a decoder) may decode instructions, and generate as an output one or more micro-operations, microcode entry points, microinstructions, other instructions, or other control signals, which are decoded from, or which otherwise reflect, or are derived from, the original instructions. The decode unit 540 may be implemented using various different mechanisms. Examples of suitable mechanisms include, but are not limited to, look-up tables, hardware implementations, programmable logic arrays (PLAs), microcode read only memories (ROMs), etc. The instruction cache unit 534 is further coupled to the memory unit 570. The decode unit 540 is coupled to a rename/allocator unit 552 in the execution engine unit 550.

The execution engine unit 550 includes the rename/allocator unit 552 coupled to a retirement unit 554 and a set of one or more scheduler unit(s) 556. The scheduler unit(s) 556 represents any number of different schedulers, including reservations stations (RS), central instruction window, etc. The scheduler unit(s) 556 is coupled to the physical register file(s) unit(s) 558. Each of the physical register file(s) unit(s) 558 represents one or more physical register files, different ones of which store one or more different data types, such as scalar integer, scalar floating point, packed integer, packed floating point, vector integer, vector floating point, etc., status (e.g., an address instruction pointer that is the address of the next instruction to be executed), etc. The physical register file(s) unit(s) 558 is overlapped by the retirement unit 554 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 554 and the physical register file(s) unit(s) 558 are coupled to the execution cluster(s) 560. The execution cluster(s) 560 includes a set of one or more execution units 562 and a set of one or more memory access units 564. The execution units 562 may perform various operations (e.g., shifts, addition, subtraction, multiplication) and operate on various types of data (e.g., scalar floating point, packed integer, packed floating point, vector integer, vector floating point).

While some aspects may include a number of execution units dedicated to specific functions or sets of functions, other aspects may include only one execution unit or multiple execution units that all perform all functions. The scheduler unit(s) 556, physical register file(s) unit(s) 558, and execution cluster(s) 560 are shown as being possibly plural because certain aspects create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain aspects are implemented in which only the execution cluster of this pipeline has the memory access units 564. It should also be understood that where separate pipelines are used, one or more of these pipelines may be out-of-order issue/execution and the rest in order.

The set of memory access units 564 is coupled to the memory unit 570, which may include a data prefetcher, a data TLB unit 572, a data cache unit (DCU) 574, and a level 2 (L2) cache unit 576, to name a few examples. In some aspects, DCU 574 is also known as a first level data cache (L1 cache). The DCU 574 may handle multiple outstanding cache misses and continue to service incoming stores and loads. It also supports maintaining cache coherency. The data TLB unit 572 is a cache used to improve virtual address translation speed by mapping virtual and physical address spaces. In one exemplary aspect, the memory access units 564 may include a load unit, a store address unit, and a store data unit, each of which is coupled to the data TLB unit 572 in the memory unit 570. The L2 cache unit 576 may be coupled to one or more other levels of cache and eventually to the main memory.

In one aspect, the data prefetcher speculatively loads/prefetches data to the DCU 574 by automatically predicting which data a program is about to consume. Prefetching may refer to transferring data stored in one memory location (e.g., position) of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

The processor 500 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may not support multithreading (e.g., executing two or more parallel sets of operations or threads, time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology)).

While register renaming is described in the context of out-of-order execution, it should be understood that register renaming may be used in an in-order architecture. While the illustrated aspect of the processor also includes a separate instruction and data cache units and a shared L2 cache unit, alternative aspects may have a single internal cache for both instructions and data, such as, for example, a Level 1 (L1) internal cache, or multiple levels of internal cache. In some aspects, the system may include a combination of an internal cache and an external cache that is external to the core and/or the processor. Alternatively, all of the cache may be external to the core and/or the processor.

Figure 6:
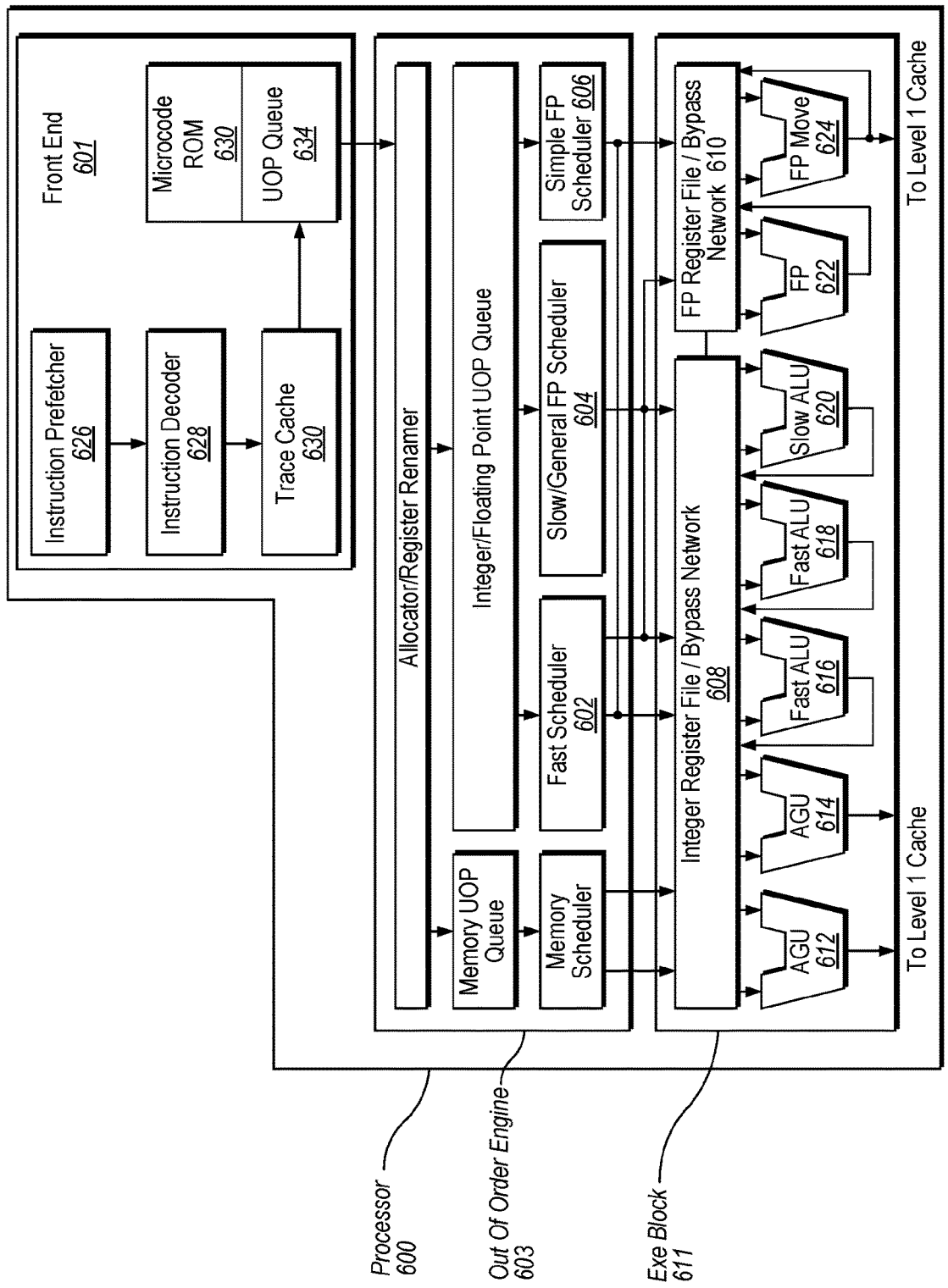
FIG. 6 illustrates a block diagram of the micro-architecture for a processor that includes logic circuits to perform access control, according to one aspect.

FIG. 6 illustrates a block diagram of the micro-architecture for a processor 600 that includes logic circuits to perform access control according to one aspect. In one aspect, processor 600 is the communication system 100 of FIG. 1.

In some aspects, an instruction in accordance with one aspect may be implemented to operate on data elements having sizes of byte, word, doubleword, quadword, etc., as well as datatypes, such as single and double precision integer and floating point datatypes. In one aspect the in-order front end 601 is the part of the processor 600 that fetches instructions to be executed and prepares them to be used later in the processor pipeline. The aspects of the communication system 100 of FIG. 1 may be implemented in processor 600.

The in-order front end 601 may include several units. In one aspect, the instruction prefetcher 626 fetches instructions from memory and feeds them to an instruction decoder 628 which in turn decodes or interprets them. For example, in one aspect, the decoder decodes a received instruction into one or more operations called "micro-instructions" or "micro-operations" (also called micro-op or uops) that the machine may execute. In other aspects, the decoder parses the instruction into an opcode and corresponding data and control fields that are used by the micro-architecture to perform operations in accordance with one aspect. In one aspect, the trace cache 630 takes decoded uops and assembles them into program ordered sequences or traces in the uop queue 634 for execution. When the trace cache 630 encounters a complex instruction, the microcode ROM 632 provides the uops needed to complete the operation.

Some instructions are converted into a single micro-op, whereas others need several micro-ops to complete the full operation. In one aspect, if more than four micro-ops are needed to complete an instruction, the instruction decoder 628 accesses the microcode ROM 632 to do the instruction. For one aspect, an instruction may be decoded into a small number of micro-ops for processing at the instruction decoder 628. In another aspect, an instruction may be stored within the microcode ROM 632 should a number of micro-ops be needed to accomplish the operation. The trace cache 630 refers to an entry point programmable logic array (PLA) to determine a correct microinstruction pointer for reading the microcode sequences to complete one or more instructions in accordance with one aspect from the microcode ROM 632. After the microcode ROM 632 finishes sequencing micro-ops for an instruction, the in-order front end 601 of the machine resumes fetching micro-ops from the trace cache 630.

The out-of-order execution engine 603 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: the memory scheduler, the fast scheduler 602, the general or slow floating point scheduler 604, and the simple floating point scheduler 606. The fast scheduler 602, the general or slow floating point scheduler 604, and the simple floating point scheduler 606 determine when a uop is ready to execute based on the readiness of their dependent input register operand sources and the availability of the execution resources the uops need to complete their operation. The fast scheduler 602 of one aspect may schedule on each half of the main clock cycle while the other schedulers may only schedule once per main processor clock cycle. The schedulers arbitrate for the dispatch ports to schedule uops for execution.

The integer register file 608 and the floating point register file 610 sit between the fast scheduler 602, the general or slow floating point scheduler 604, and the simple floating point scheduler 606, and the address generation unit (AGU) 612, the AGU 614, the fast ALU 616, the fast ALU 618, the slow ALU 620, the floating point ALU 622, and the floating point move unit 624 in the execution block 611. There is an integer register file 608 for integer and a floating point register file 610 for floating point operations, respectively. Each of the integer register file 608 and the floating point register file 610 of one aspect also includes a bypass network that may bypass or forward just completed results that have not yet been written into the register file to new dependent uops. The integer register file 608 and the floating point register file 610 are also capable of communicating data with the other. For one aspect, the integer register file 608 is split into two separate register files, one register file for the low order 32 bits of data and a second register file for the high order 32 bits of data. The floating point register file 610 of one aspect has 128 bit wide entries because floating point instructions typically have operands from 64 to 128 bits in width.

The execution block 611 includes an AGU 612, an AGU 614, a fast ALU 616, a fast ALU 618, a slow ALU 620, a floating point ALU 622, and a floating point move unit 624, where the instructions are actually executed. This section includes the integer register file 608 and the floating point register file 610 that store the integer and floating point data operand values that the micro-instructions need to execute. The processor 600 of one aspect is comprised of a number of execution units: an AGU 612, an AGU 614, a fast ALU 616, a fast ALU 618, a slow ALU 620, a floating point ALU 622, and a floating point move unit 624. For one aspect, the floating point ALU 622, the floating point move unit 624, execute floating point, MMX, SIMD, and SSE, or other operations. The floating point ALU 622 of one aspect includes a 64-bit by 64-bit floating point divider to execute divide, square root, and remainder micro-ops. For aspects of the present disclosure, instructions involving a floating point value may be handled with the floating point hardware.

In one aspect, the ALU operations go to the fast ALU 616 and the fast ALU 618. The fast ALU 616 and the fast ALU 618, of one aspect may execute fast operations with an effective latency of half a clock cycle. For one aspect, most complex integer operations go to the slow ALU 620 as the slow ALU 620 includes integer execution hardware for long latency type of operations, such as a multiplier, shifts, flag logic, and branch processing. Memory load/store operations are executed by the AGU 612 and the AGU 614. For one aspect, the fast ALU 616, the fast ALU 618, and the slow ALU 620 are described in the context of performing integer operations on 64-bit data operands. In alternative aspects, the fast ALU 616, the fast ALU 618, and the slow ALU 620 may be implemented to support a variety of data bits including 16, 32, 128, 256, etc. Similarly, the floating point ALU 622 and floating point move unit 624 may be implemented to support a range of operands having bits of various widths. For one aspect, the floating point ALU 622 and floating point move unit 624 may operate on 128 bits wide packed data operands in conjunction with SIMD and multimedia instructions.

In one aspect, the fast scheduler 602, the general or slow floating point scheduler 604, and the simple floating point scheduler 606 dispatch dependent operations before the parent load has finished executing. As uops are speculatively scheduled and executed in processor 600, the processor 600 also includes logic to handle memory misses. If a data load misses in the data cache, there may be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one aspect of a processor are also designed to catch instruction sequences for text string comparison operations.

The processor 600 also includes logic to implement access control according to one aspect. In one aspect, the execution block 611 of processor 600 may include PEL, to perform access control according to the description herein.

The term "registers" may refer to the onboard processor storage locations that are used as part of instructions to identify operands. In other words, registers may be those that are usable from the outside of the processor (from a programmer's perspective). However, the registers of an aspect should not be limited in meaning to a particular type of circuit. Rather, a register of an aspect is capable of storing and providing data and performing the functions described herein. The registers described herein may be implemented by circuitry within a processor using any number of different techniques, such as dedicated physical registers, dynamically allocated physical registers using register renaming, combinations of dedicated and dynamically allocated physical registers, etc. In one aspect, integer registers store thirty-two-bit integer data. A register file of one aspect also contains eight multimedia SIMD registers for packed data.

For the discussions herein, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, may operate with packed data elements that accompany SIMD and SSE instructions. Similarly, 128 bits wide XMM registers relating to SSE2, SSE3, SSE4, or beyond (referred to generically as "SSEx") technology may also be used to hold such packed data operands. In one aspect, in storing packed data and integer data, the registers do not need to differentiate between the two data types. In one aspect, integer and floating point are either contained in the same register file or different register files. Furthermore, in one aspect, floating point and integer data may be stored in different registers or the same registers.

Figure 7:
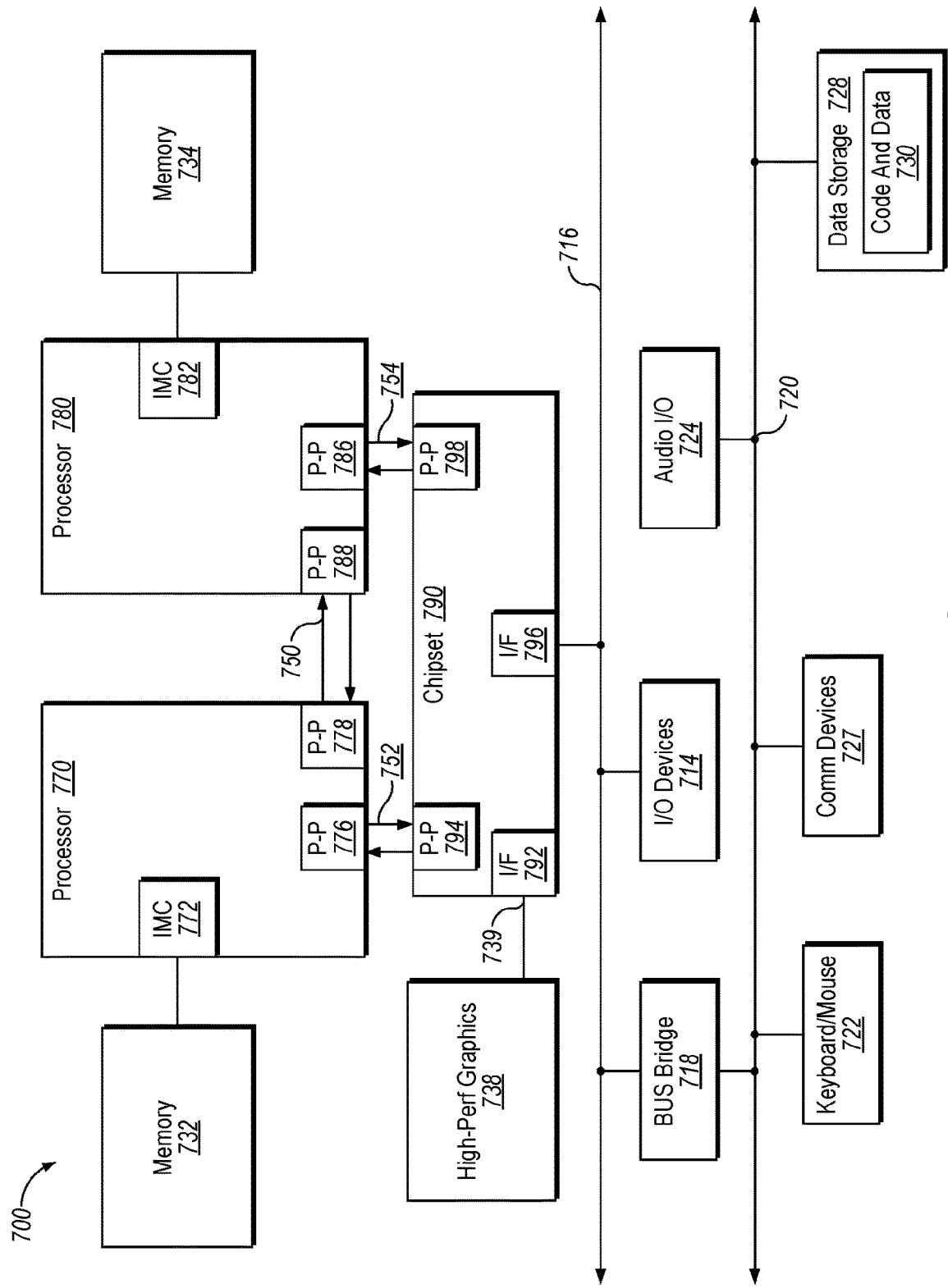
FIG. 7 is a block diagram of a computing system according to one implementation.

Aspects may be implemented in many different system types. Referring now to FIG. 7, shown is a block diagram of a multiprocessor system 700 in accordance with an implementation. As shown in FIG. 7, multiprocessor system 700 is a point-to-point interconnect system and includes a first processor 770 and a second processor 780 coupled via a point-to-point (P-P) interconnect 750. As shown in FIG. 7, each of the first processor 770 and the second processor 780 may be multicore processors, including first and second processor cores (i.e., processor cores 774a and 774b and processor cores 784a and 784b), although potentially many more cores may be present in the processors. The processors each may include hybrid write mode logics in accordance with an aspect of the present. The aspects of the communication system 100 of FIG. 1 may be implemented in the first processor 770, the second processor 780, or both.

While shown with the first processor 770 and the second processor 780, it is to be understood that the scope of the present disclosure is not so limited. In other implementations, one or more additional processors may be present in a given processor.

The first processor 770 and the second processor 780 are shown including the control logic (CL) 772 and the CL 782, respectively. The first processor 770 also includes as part of its bus controller units point-to-point (P-P) interface 776 and the P-P interface 788; similarly, second processor 780 includes P-P interfaces 786 and 788. The first processor 770 and the second processor 780 may exchange information via a P-P interconnect 750 using the P-P interface 778 and the P-P interface 788. As shown in FIG. 7, the CL 772 and the CL 782 couple the processors to respective memories, namely a memory 732 and a memory 734, which may be portions of main memory locally attached to the respective processors.

The first processor 770 and the second processor 780 may each exchange information with a chipset 790 via individual P-P interface 752 and P-P interface 754 using the P-P interface 776, the P-P interface 794, the P-P interface 786, and the P-P interface 798. Chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low-power mode.

Chipset 790 may be coupled to a first bus 716 via an interface 796. In one aspect, the first bus 716 may be a Peripheral Component Interconnect (PCI) bus, or a bus such as a PCI Express bus or another third generation I/O interconnect bus, although the scope of the present disclosure is not so limited.

As shown in FIG. 7, various I/O devices 714 may be coupled to first bus 716, along with a bus bridge 718 which couples first bus 716 to a second bus 720. In one aspect, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one aspect. Further, an audio I/O 724 may be coupled to second bus 720. Note that other architectures are possible. For example, instead of the point-to-point architecture of FIG. 7, a system may implement a multi-drop bus or other such architecture.

Figure 8:
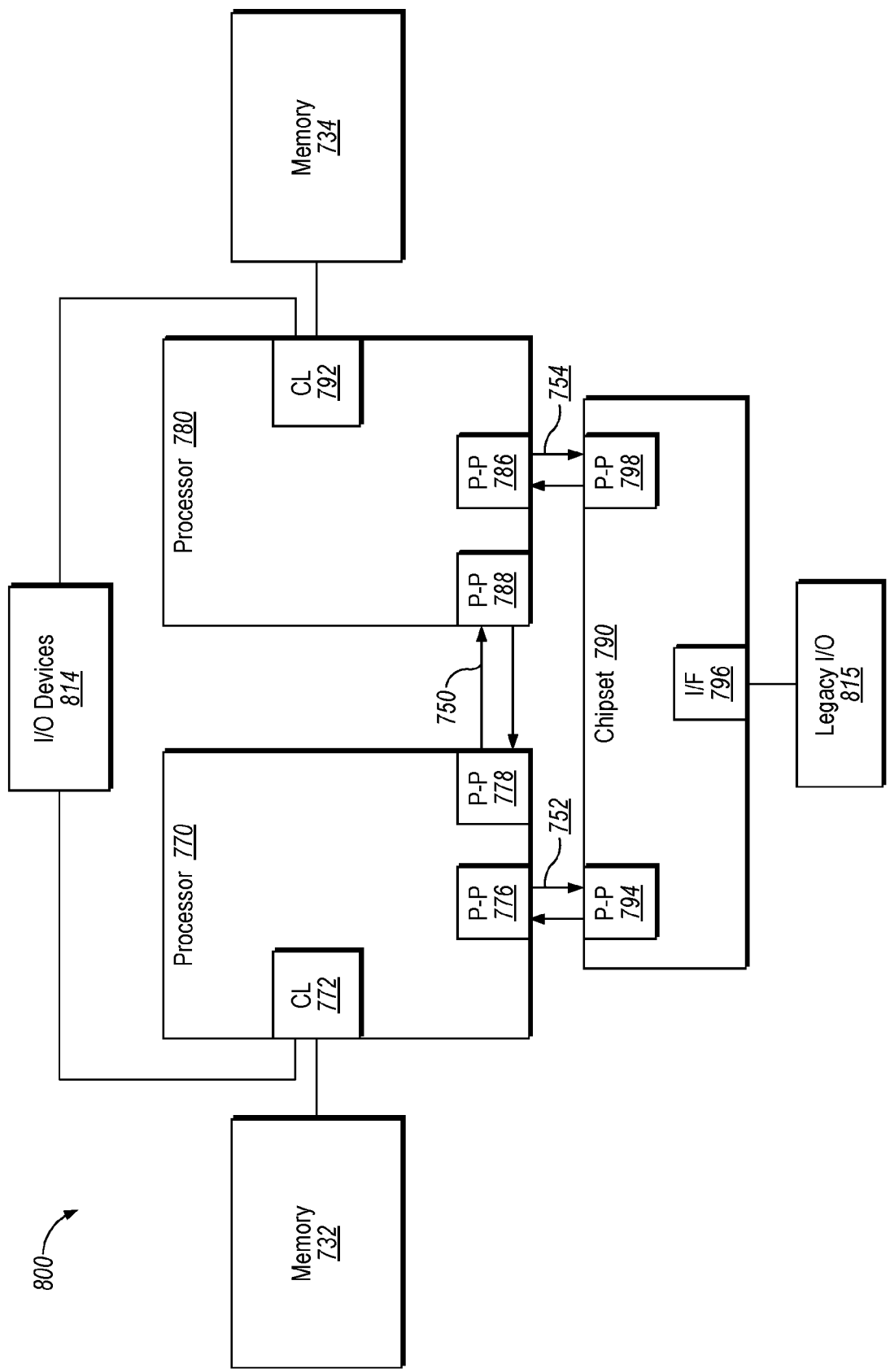
FIG. 8 is a block diagram of a computing system according to another implementation.

Referring now to FIG. 8, shown is a block diagram of a third system 800 in accordance with an aspect of the present disclosure. Like elements in FIGS. 7 and 8 bear like reference numerals and certain aspects of FIG. 7 have been omitted from FIG. 8 in order to avoid obscuring other aspects of FIG. 8.

FIG. 8 illustrates that the first processor 770 and the second processor 780 may include integrated memory, the CL 772 and, the CL 782, respectively. For at least one aspect, the CL 772 and the CL 782 may include integrated memory controller units such as described herein. In addition, the CL 772 and the CL 782 may also include I/O control logic. FIG. 8 illustrates that the memory 732 and the memory 734 are coupled to the CL 772 and the CL 782. FIG. 8 also illustrates that I/O devices 814 are also coupled to the CL 772 and the CL 782. Legacy I/O devices 815 are coupled to the chipset 790. The aspects of the communication system 100 may be implemented in the first processor 770, the second processor 780, or both.

Figure 9:
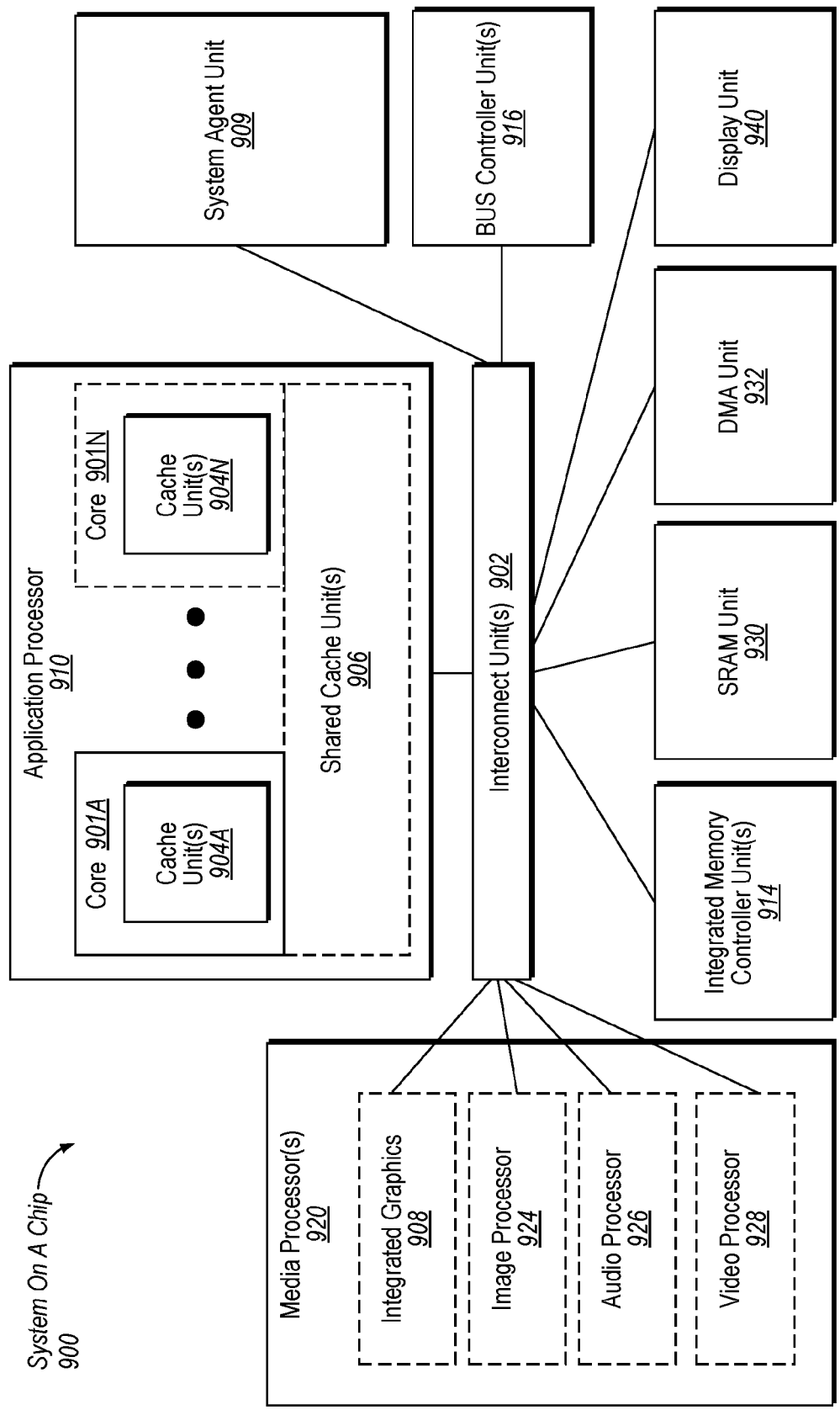
FIG. 9 is a block diagram of a system-on-a-chip according to one implementation.

FIG. 9 is an exemplary system on a chip (SoC) 900 that may include one or more of the cores 901. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, microcontrollers, cell phones, portable media players, handheld devices, and various other electronic devices, are also suitable. In general, a huge variety of systems or electronic devices capable of incorporating a processor and/or other execution logic as disclosed herein are generally suitable.

Referring now to FIG. 9, shown is a block diagram of a SoC 900 in accordance with an aspect of the present disclosure. Also, dashed lined boxes are features on more advanced SoCs. In FIG. 9, an interconnect unit(s) 902 is coupled to: an application processor 910 which includes a set of one or more cores 901A-N and shared cache unit(s) 906; a system agent unit 909; a bus controller unit(s) 916; an integrated memory controller unit(s) 914; a set or one or more media processors 920 which may include integrated graphics logic 908, an image processor 924 for providing still and/or video camera functionality, an audio processor 926 for providing hardware audio acceleration, and a video processor 928 for providing video encode/decode acceleration; a static random access memory (SRAM) unit 930; a direct memory access (DMA) unit 932; and a display unit 940 for coupling to one or more external displays. The aspects of the pages additions and content copying may be implemented in the SoC 900.

Figure 10:
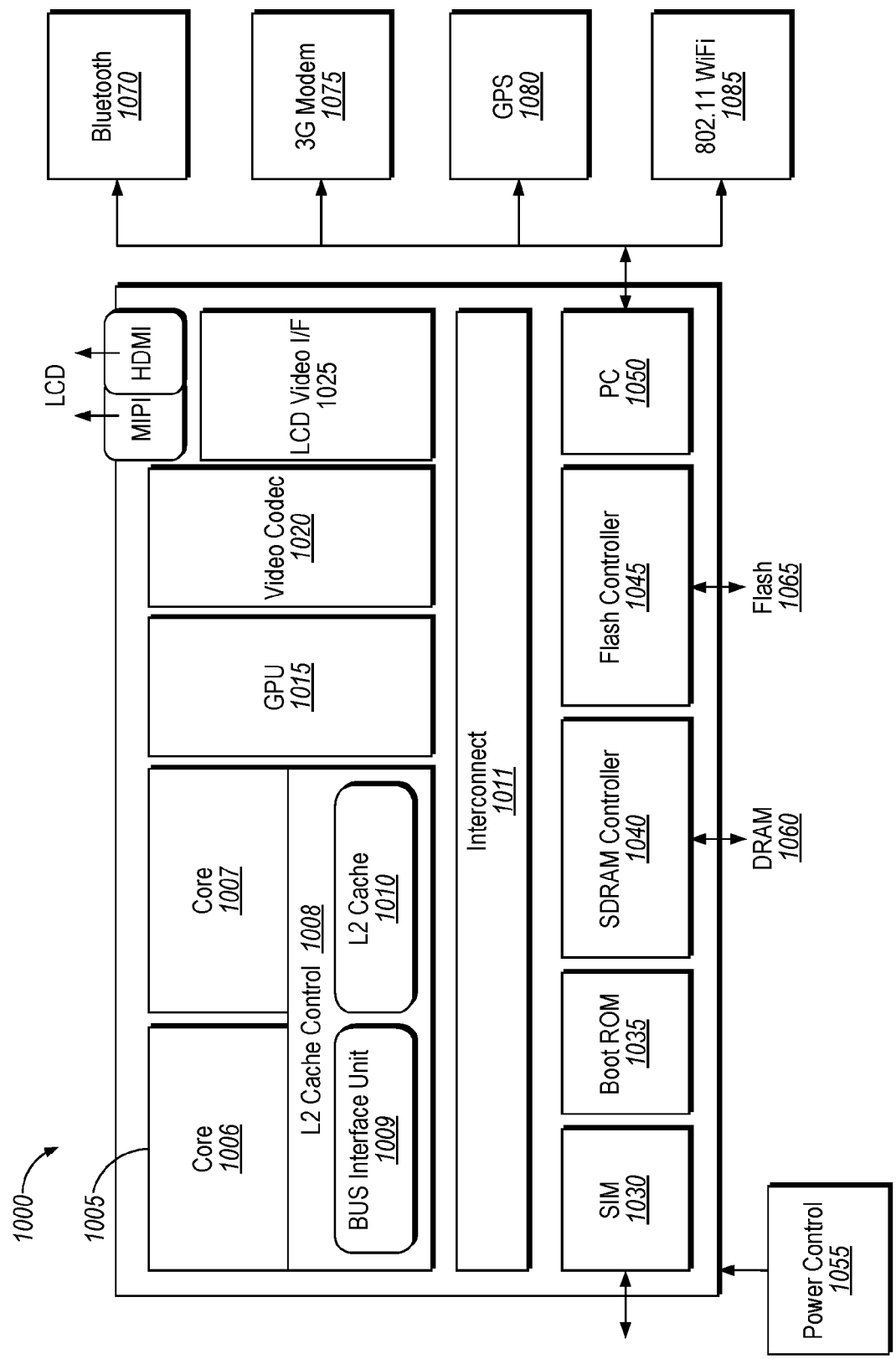
FIG. 10 illustrates another implementation of a block diagram of a computing system.

Turning next to FIG. 10, an aspect of a system-on-a-chip (SoC) 1000 design in accordance with aspects of the disclosure is depicted. As an illustrative example, SoC 1000 is included in user equipment (UE). In one aspect, UE refers to any device to be used by an end-user to communicate, such as a hand-held phone, smartphone, tablet, ultra-thin notebook, notebook with broadband adapter, or any other similar communication device. A UE may connect to a base station or node, which may correspond in nature to a mobile station (MS) in a GSM network. The aspects of the communication system 100 of FIG. 1 may be implemented in SoC 1000.

Here, SoC 1000 includes 2 cores—1006 and 1007. Similar to the discussion above, cores 1006 and 1007 may conform to an Instruction Set Architecture, such as a processor having the Intel® Architecture Core™, an Advanced Micro Devices, Inc. (AMD) processor, an MIPS-based processor, an ARM-based processor design, or a customer thereof, as well as their licensees or adopters. Cores 1006 and 1007 are coupled to cache control 1008 that is associated with bus interface unit 1009 and L2 cache 1010 to communicate with other parts of SoC 1000. Interconnect 1011 includes an on-chip interconnect, such as an IOSF, AMBA, or other interconnects discussed above, which may implement one or more aspects of the described disclosure.

Interconnect 1011 provides communication channels to the other components, such as a Subscriber Identity Module (SIM) 1030 to interface with a SIM card, a boot ROM 1035 to hold boot code for execution by cores 1006 and 1007 to initialize and boot SoC 1000, a SDRAM controller 1040 to interface with external memory (e.g. DRAM 1060), a flash controller 1045 to interface with non-volatile memory (e.g. Flash 1065), a peripheral control 1050 (e.g. Serial Peripheral Interface) to interface with peripherals, video codecs 1020 and Video interface 1025 to display and receive input (e.g. touch-enabled input), GPU 1015 to perform graphics related computations, etc. Any of these interfaces may incorporate aspects of the aspects described herein.

In addition, the system illustrates peripherals for communication, such as a Bluetooth module 1070, 3G modem 1075, GPS 1080, and Wi-Fi 1085. Note as stated above, a UE includes a radio for communication. As a result, these peripheral communication modules may not all be included. However, in a UE some form of a radio for external communication should be included.

Figure 11:
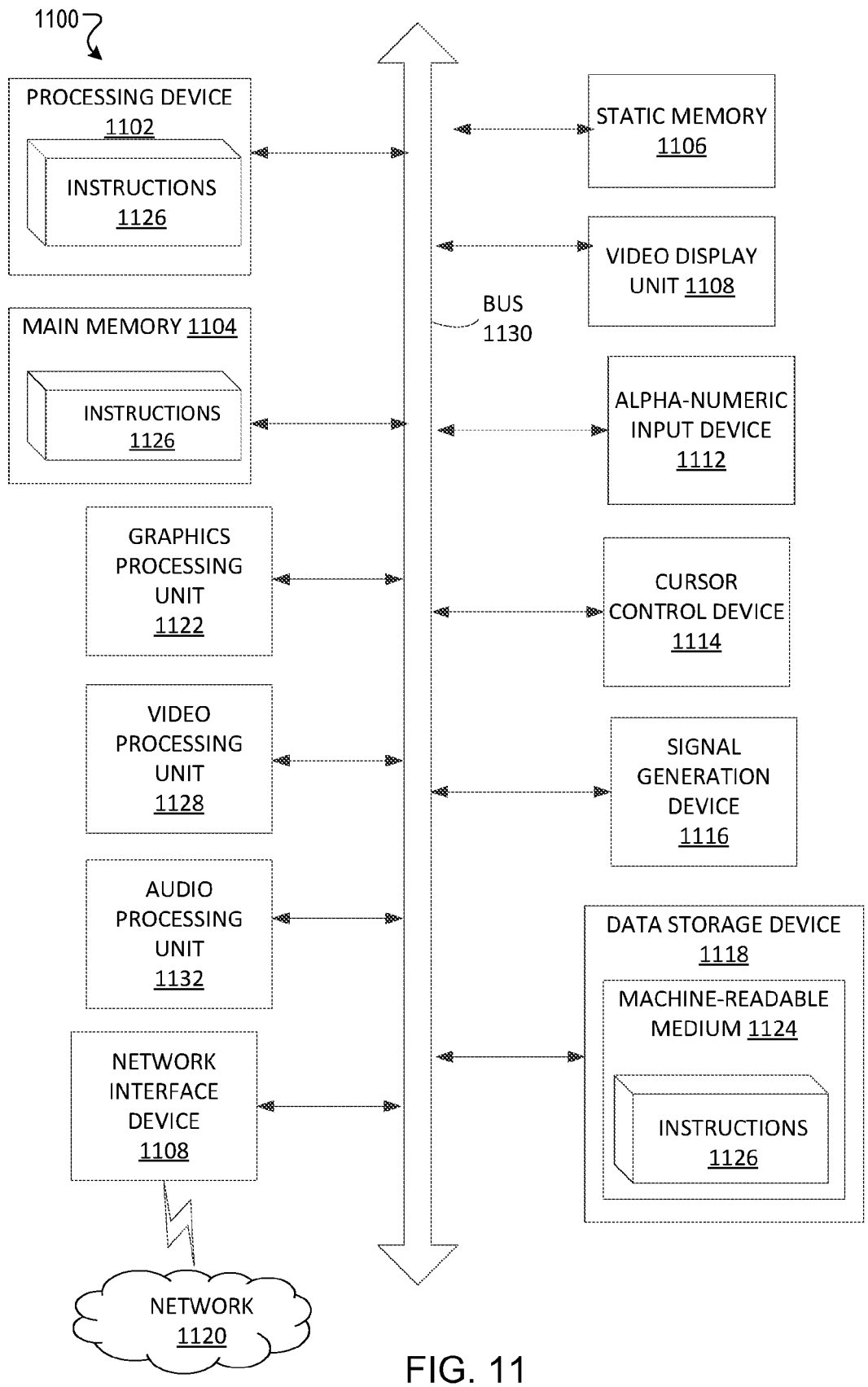
FIG. 11 illustrates another implementation of a block diagram of a computing system.

FIG. 11 illustrates a diagrammatic representation of a machine in the example form of a computing system 1100 within which a set of instructions, for causing the machine to perform any one or more of the methodologies discussed herein, may be executed. In alternative aspects, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. The aspects of the communication system 100 of FIG. 1 may be implemented in computing system 1100.

The computing system 1100 includes a processing device 1102, main memory 1104 (e.g., read-only memory (ROM), flash memory, dynamic random access memory (DRAM) (such as synchronous DRAM (SDRAM) or DRAM (RDRAM), etc.), a static memory 1106 (e.g., flash memory, static random access memory (SRAM), etc.), and a data storage device 1118, which communicate with each other via a bus 1130.

Processing device 1102 represents one or more general-purpose processing devices such as a microprocessor, central processing unit, or the like. More particularly, the processing device may be a complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1102 may also be one or more special-purpose processing devices such as an application specific integrated circuit (ASIC), a field-programmable gate array (FPGA), a digital signal processor (DSP), network processor, or the like. In one aspect, processing device 1102 may include one or processor cores. The processing device 1102 is configured to execute the instructions 1126 (e.g., processing logic) for performing the operations discussed herein. In one aspect, processing device 1102 may include the communication system 100 of FIG. 1. Alternatively, the computing system 1100 may include other components as described herein. It should be understood that the core may not support multithreading (e.g., executing two or more parallel sets of operations or threads, time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

The computing system 1100 may further include a network interface device 1108 communicably coupled to a network 1120. The computing system 1100 also may include a video display unit 1110 (e.g., a liquid crystal display (LCD) or a cathode ray tube (CRT)), an alphanumeric input device 1112 (e.g., a keyboard), a cursor control device 1114 (e.g., a mouse), a signal generation device 1116 (e.g., a speaker), or other peripheral devices. Furthermore, computing system 1100 may include a graphics processing unit 1122, a video processing unit 1128 and an audio processing unit 1132. In another aspect, the computing system 1100 may include a chipset (not illustrated), which refers to a group of integrated circuits, or chips, that are designed to work with the processing device 1102 and controls communications between the processing device 1102 and external devices. For example, the chipset may be a set of chips on a motherboard that links the processing device 1102 to very high-speed devices, such as main memory 1104 and graphic controllers, as well as linking the processing device 1102 to lower-speed peripheral buses of peripherals, such as USB, PCI or ISA buses.

The data storage device 1118 may include a computer-readable storage medium 1124 on which is stored instructions 1126 (e.g., software) embodying any one or more of the methodologies of functions described herein. The instructions 1126 (e.g., software) may also reside, completely or at least partially, within the main memory 1104 as instructions 1126 and/or within the processing device 1102 as processing logic during execution thereof by the computing system 1100; the main memory 1104 and the processing device 1102 also constituting computer-readable storage media.

The computer-readable storage medium 1124 may also be used to store instructions 1126 utilizing the processing device 1102, such as the processing unit 120 described with respect to FIG. 1, and/or a software library containing methods that call the above applications. While the computer-readable storage medium 1124 is shown in an example aspect to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present aspects. The term "computer-readable storage medium" shall accordingly be taken to include, but not be limited to, solid-state memories, and optical and magnetic media.

The following examples pertain to further aspects.

In Example 1, an apparatus comprises: a baseband processor configured to receive digital samples of a first wireless local area network (WLAN) signal demodulated with a first phase locked loop (PLL); the baseband processor to determine whether to switch from using the first PLL to demodulate the first WLAN signal to using a second PLL to demodulate the first WLAN signal; a selection circuit coupled to the first PLL and the second PLL, the selection circuit being configured to switch from the first PLL to the second PLL based on the determination; and the baseband processor configured to receive additional digital samples of the first WLAN signal demodulated with the second PLL.

In Example 2, the baseband processor of Example 1 is further configured to: send a disable command to the first PLL to disable the first PLL from demodulating the first WLAN signal; and send an enable command to the second PLL to enable the second PLL to demodulate the first WLAN signal.

In Example 3, the baseband processor of Example 1 is further configured to: inspect a header of the first WLAN signal; and send a control signal to the selection circuit when the header identifies a first format of the first WLAN signal, wherein the selection circuit is configured to switch from the first PLL to the second PLL based on the control signal, wherein the first PLL remains active when the header identifies a second format of the first WLAN signal.

In Example 4, the header of Example 3 comprises a legacy short training field (L-STF) and a legacy long training field (L-LFT).

In Example 5, the L-STF of Example 4 indicates whether the first WLAN signal is in the first format or the second format.

In Example 6, the first form of Example 3 is a very high throughput (VHT) format, a high throughput (HT) format, or a high efficiency (HE) format.

In Example 7, the first PLL of Example 3 is a low-power PLL and the second PLL of Example 3 is a high-power PLL.

In Example 8, the baseband processor of Example 1 is further configured to: monitor for the first WLAN signal; and in response to receiving the first WLAN signal, demodulate the digital samples of the first WLAN signal using the first PLL.

In Example 9, the baseband processor of Example 1 is further configured to select a frequency of the second PLL to demodulate the first WLAN signal.

In Example 10, the baseband processor of Example 1 is further configured to: determine that no first WLAN signal is received; and switch from using the second PLL to monitor for a second WLAN signal to using the first PLL to monitor for the second WLAN signal.

Various aspects may have different combinations of the structural features described above. For instance, all optional features of the apparatus described above may also be implemented with respect to a system described herein and specifics in the examples may be used anywhere in one or more aspects.

In Example 11, a system comprises: a mixer to receive a first signal from an antenna; a processing component coupled to the mixer; a selection circuit coupled to the processing component and to the mixer; a first means for demodulating the signal, wherein the first means is coupled to the selection circuit; and a second means for demodulating the signal, the second means coupled to the selection circuit, wherein the processing component is configured to: receive the first signal from the mixer; and in response to the receiving the first signal, send a first signal to the selection circuit to disconnect the first means from the mixer and connect the second means to the mixer.

In Example 12, the selection circuit of Example 11 is a glitch-less multiplexer that switches between a first clock source of the first means and a second clock source of the second means, wherein the glitch-less multiplexer is controlled by the first signal.

In Example 12, the first means of Example 11 operates at a first power level and the second means of Example 11 operates at a second power level, wherein the second power level is higher than the first power level.

In Example 14, the processing component of Example 11 is further configured to send a second signal to the selection circuit to connect the first means to the mixer when the system is operating in a power saving mode.

In Example 15, the system of Example 11 further comprises: the antenna to receive the first signal; an amplifier coupled to the antenna, wherein the amplifier is configured to amplify the first signal; and an analog to digital converter (ADC) coupled to the mixer, wherein the ADC is configured to convert the first signal from an analog format to a digital format.

In Example 16, the processing component of Example 11 is further configured to: receive a second signal from the mixer; inspect a header of the second signal; and send the first signal to the selection circuit to disconnect the first means from the mixer and connect the second means to the mixer when the header identifies a first format of the second signal, wherein the first means remains connected to the mixer when the header identifies a second format of the first signal.

In Example 17, the processing component of Example 11 is a modem or a processor core.

Various aspects may have different combinations of the structural features described above. For instance, all optional features of the computing system described above may also be implemented with respect to the method or process described herein and specifics in the examples may be used anywhere in one or more aspects.

In Example 18, a method comprises: receiving, by a baseband processor, digital samples of a first wireless local area network (WLAN) signal demodulated with a first phase locked loop (PLL); determining, by the baseband processor, whether to switch from using the first PLL to demodulate the first WLAN signal to using a second PLL to demodulate the first WLAN signal; selecting, by the baseband processor, the second PLL to demodulate additional digital samples of the first WLAN signal based on a determination to switch from using the first PLL to the second PLL; and receiving, by the baseband processor, the additional digital samples of the first WLAN signal demodulated with the second PLL.

In Example 19, the method of Example 18, the selecting the second PLL further comprises: determining, by the baseband processor, that a header of the signal indicates that the signal is in a defined format; disconnecting the first PLL from a mixer using a selection circuit; and connecting the second PLL to the mixer using the selection circuit.

In Example 20, the method of Example 18 further comprises: determining, by the baseband processor, that an entire signal has been received; and selecting, by the baseband processor, the first PLL to switch back from using the second PLL to using the first PLL based on a determination that the entire signal has been received.

While the present disclosure has been described with respect to a limited number of aspects, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and microarchitectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well-known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computing system have not been described in detail in order to avoid unnecessarily obscuring the present disclosure.

The aspects are described with reference to access control in specific integrated circuits, such as in computing platforms or microprocessors. The aspects may also be applicable to other types of integrated circuits and programmable logic devices. For example, the disclosed aspects are not limited to desktop computing systems or portable computers, such as the Intel® Ultrabooks™ computers. And may be also used in other devices, such as handheld devices, tablets, other thin notebooks, systems on a chip (SoC) devices, and embedded applications. Some examples of handheld devices include cellular phones, Internet standard devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that may perform the functions and operations taught below. It is described that the system may be any kind of computer or embedded system. The disclosed aspects may especially be used for low-end devices, like wearable devices (e.g., watches), electronic implants, sensory and control infrastructure devices, controllers, supervisory control, and data acquisition (SCADA) systems, or the like. Moreover, the apparatuses, methods, and systems described herein are not limited to physical computing devices, but may also relate to software optimizations for energy conservation and efficiency. As will become readily apparent in the description below, the aspects of methods, apparatuses, and systems described herein (whether in reference to hardware, firmware, software, or a combination thereof) are vital to a 'green technology' future balanced with performance considerations.

Although the aspects herein are described with reference to a processor, other aspects are applicable to other types of integrated circuits and logic devices. Similar techniques and teachings of aspects of the present disclosure may be applied to other types of circuits or semiconductor devices that may benefit from higher pipeline throughput and improved performance. The teachings of aspects of the present disclosure are applicable to any processor or machine that performs data manipulations. However, the present disclosure is not limited to processors or machines that perform 512 bit, 256 bit, 128 bit, 64 bit, 32 bit, or 16 bit data operations and may be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of aspects of the present disclosure rather than to provide an exhaustive list of all possible implementations of aspects of the present disclosure.

Although the below examples describe instruction handling and distribution in the context of execution units and logic circuits, other aspects of the present disclosure may be accomplished by way of a data or instructions stored on a machine-readable, tangible medium, which when performed by a machine cause the machine to perform functions consistent with at least one aspect of the disclosure. In one aspect, functions associated with aspects of the present disclosure are embodied in machine-executable instructions. The instructions may be used to cause a general-purpose or special-purpose processor that is programmed with the instructions to perform the steps of the present disclosure. Aspects of the present disclosure may be provided as a computer program product or software which may include a machine or computer-readable medium having stored thereon instructions which may be used to program a computer (or other electronic devices) to perform one or more operations according to aspects of the present disclosure. Alternatively, operations of aspects of the present disclosure might be performed by specific hardware components that contain fixed-function logic for performing the operations, or by any combination of programmed computer components and fixed-function hardware components.

Instructions used to program logic to perform aspects of the disclosure may be stored within a memory in the system, such as DRAM, cache, flash memory, or other storage. Furthermore, the instructions may be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine-readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of aspects of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, a reference to a module, in one aspect, refers to the hardware, which is specifically configured to recognize and/or execute the code to be held on a non-transitory medium. Furthermore, in another aspect, use of a module refers to the non-transitory medium including the code, which is specifically adapted to be executed by the microcontroller to perform predetermined operations. And as may be inferred, in yet another aspect, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one aspect, use of the term logic includes hardware, such as transistors, registers, or other hardware, such as programmable logic devices.

Use of the phrase 'configured to,' in one aspect, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, wherein the latent state the apparatus, hardware, and/or element is designed to perform a particular task when the apparatus, hardware, and/or element is operating.

Furthermore, use of the phrases 'to,' 'capable of/to,' and or 'operable to,' in one aspect, refers to some apparatus, logic, hardware, and/or element designed in such a way to enable use of the apparatus, logic, hardware, and/or element in a specified manner. Note as above that use of to, capable to, or operable to, in one aspect, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one aspect, a storage cell, such as a transistor or flash cell, may be capable of holding a single logical value or multiple logical values. However, other representations of values in computing systems have been used. For example, the decimal number ten may also be represented as a binary value of 1010 and a hexadecimal letter A. Therefore, a value includes any representation of information capable of being held in a computing system.

Moreover, states may be represented by values or portions of values. As an example, a first value, such as a logical one, may represent a default or initial state, while a second value, such as a logical zero, may represent a non-default state. In addition, the terms reset and set, in one aspect, refer to a default and an updated value or state, respectively. For example, a default value potentially includes a high logical value, i.e. reset, while an updated value potentially includes a low logical value, i.e. set. Note that any combination of values may be utilized to represent any number of states.

The aspects of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform aspects of the disclosure may be stored within a memory in the system, such as DRAM, cache, flash memory, or other storage. Furthermore, the instructions may be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one aspect" or "an aspect" means that a particular feature, structure, or characteristic described in connection with the aspect is included in at least one aspect of the present disclosure. Thus, the appearances of the phrases "in one aspect" or "in an aspect" in various places throughout this specification are not necessarily all referring to the same aspect. Furthermore, the particular features, structures, or characteristics may be combined in any suitable manner in one or more aspects.

In the foregoing specification, a detailed description has been given with reference to specific exemplary aspects. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of aspect and other exemplary language does not necessarily refer to the same aspect or the same example, but may refer to different and distinct aspects, as well as potentially the same aspect.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein may be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an aspect" or "one aspect" or "an implementation" or "one implementation" throughout is not intended to mean the same aspect or implementation unless described as such. Also, the terms "first," "second," "third," "fourth," etc. as used herein are meant as labels to distinguish among different elements and may not necessarily have an ordinal meaning according to their numerical designation.

What is claimed is:

1. An apparatus comprising:
    a baseband processor configured to receive digital samples of a first wireless local area network (WLAN) signal demodulated with a first phase locked loop (PLL), the first WLAN signal comprising a packet including a packet header;
    the baseband processor to determine a packet format based on the packet header;
    the baseband processor to determine whether to switch from using the first PLL to demodulate the first WLAN signal to using a second PLL to demodulate the first WLAN signal based on the packet format;
    a selection circuit coupled to the first PLL and the second PLL, the selection circuit being configured to switch from the first PLL to the second PLL based on the determination;
    wherein when the packet format is a higher data rate packet format, the baseband processor is configured to switch to use the second PLL to demodulate subsequent portions of the packet following the packet header, and
    wherein when the packet format is a lower data rate packet format, the baseband processor is configured to continue to use the first PLL to demodulate the subsequent portions of the packet.

2. The apparatus of claim 1, wherein prior to switching from the first PLL to the second PLL, the baseband processor is further configured to:
    send an enable command to the second PLL to enable the second PLL in response to a determination that the packet format is the higher date rate packet format;
    match frequency and synchronize timing of output signals of the first and second PLLs; and
    send a disable command to the first PLL to disable the first PLL after synchronization and lock of the second PLL.

3. The apparatus of claim 1, wherein the baseband processor is further configured to:
    inspect the header of the packet using the first PLL.

4. The apparatus of claim 2, wherein the header comprises a legacy short training field (L-STF) and a legacy long training field (L-LFT), and
    wherein the L-STF indicates whether the first WLAN signal is in the first format or the second format.

5. The apparatus of claim 2, wherein the first format is associated with a lower signal-to-noise ratio (SNR) threshold, and the second format is associated with a higher SNR threshold, and
    wherein the second PLL generates lower-noise output to allow the baseband processor to meet the higher SNR threshold of the second format.

6. The apparatus of claim 2, wherein the first format is a very high throughput (VHT) format, a high throughput (HT) format, or a high efficiency (HE) format, and wherein the second format is an extremely high throughout (EHT) format in accordance with an IEEE 802.11ax standard.

7. The apparatus of claim 1, wherein the first PLL is a lower-power PLL for demodulating packet formats associated with a lower signal-to-noise ratio (SNR) threshold and the second PLL is a higher-power PLL for demodulating packet formats associated with a higher SNR threshold.

8. The apparatus of claim 1, wherein the baseband processor is further configured to:
monitor for the first WLAN signal using the first PLL; and
in response to receiving the first WLAN signal, demodulate the digital samples of the packet header using the first PLL.

9. The apparatus of claim 2, wherein the selection circuit is a glitch-less multiplexer that switches between a first clock source of the first PLL and a second clock source of the second PLL, wherein the glitch-less multiplexer is controlled by the baseband processor.

10. The apparatus of claim 9, wherein the first PLL operate at a first power level and the second PLL operates at a second power level, wherein the second power level is higher than the first power level.

11. The apparatus of claim 10, wherein the baseband processor is further configured to send a second signal to the selection circuit to connect the first PLL to the mixer when operating in a power saving mode.

12. The apparatus of claim 10, further comprising:
an antenna to receive the first WLAN signal;
an amplifier coupled to the antenna, wherein the amplifier is configured to amplify the first WLAN signal; and
an analog to digital converter (ADC) coupled to the mixer, wherein the ADC is configured to convert the first signal from an analog format to a digital format.

13. A method comprising:
receiving, by a baseband processor, digital samples of a first wireless local area network (WLAN) signal demodulated with a first phase locked loop (PLL), the first WLAN signal comprising a packet including a packet header;
determining a packet format based on the packet header
determining, by the baseband processor, whether to switch from using the first PLL to demodulate the first WLAN signal to using a second PLL to demodulate the first WLAN signal based on the packet format;
selecting, by the baseband processor, the second PLL to demodulate additional digital samples of the first WLAN signal based on a determination to switch from using the first PLL to the second PLL;
wherein when the packet format is a higher data rate packet format, the method comprises switching to use the second PLL to demodulate subsequent portions of the packet following the packet header, and
wherein when the packet format is a lower data rate packet format, the method comprises continuing to use the first PLL to demodulate the subsequent portions of the packet.

14. The method of claim 13, wherein prior to switching from the first PLL to the second PLL, the method comprises:
sending an enable command to the second PLL to enable the second PLL in response to a determination that the packet format is the higher date rate packet format;
matching frequency and synchronize timing of output signals of the first and second PLLs; and
sending a disable command to the first PLL to disable the first PLL after synchronization and lock of the second PLL.

15. The method of claim 13, further comprising:
determining, by the baseband processor, that an entire packet has been received; and
selecting, by the baseband processor, the first PLL to switch back from using the second PLL to using the first PLL based on a determination that the entire packet has been received.

16. An apparatus for a wireless device, the apparatus comprising: processing circuitry; and memory,
wherein for processing wireless local area network (WLAN) packets, the processing circuitry is configured to:
demodulate at least a packet header of a WLAN packet with an output signal of a first phase locked loop (PLL) to determine a packet format;
wherein when the packet format is a higher data rate packet format, the processing circuitry is configured to:
enable a second PLL; and
use an output signal of the second PLL to demodulate subsequent portions of the WLAN packet once a frequency and a timing of the output signals of the first and second PLLs are matched;
wherein when the packet format is not the higher data rate packet format, the processing circuitry is configured to:
refrain from enabling the second PLL; and
use the output signal of the second PLL to demodulate the subsequent portions of the WLAN packet,
wherein the memory is configured to store information indicative of the packet format.

17. The apparatus of claim 16, wherein when the packet format is the higher data rate packet format, and after enabling the second PLL, the processing circuitry is configured to:
demodulate at least some subsequent portions of the WLAN packet using the output signal of the first PLL until the frequency and the timing of output signals of the first and second PLLs are matched; and
disable the second PLL after demodulation of the WLAN packet.

* * * * *

UNITED STATES PATENT AND TRADEMARK OFFICE
CERTIFICATE OF CORRECTION

PATENT NO. : 11,303,426 B2
APPLICATION NO. : 16/643476
DATED : April 12, 2022
INVENTOR(S) : Amel et al.

Page 1 of 1

It is certified that error appears in the above-identified patent and that said Letters Patent is hereby corrected as shown below:

In the Claims

In Column 25, Line 4, in Claim 6, delete "throughout" and insert --throughput-- therefor Signed and Sealed this
Eighteenth Day of October, 2022

Katherine Kelly Vidal
*Director of the United States Patent and Trademark Office*